(12) United States Patent
Tsai

(10) Patent No.: US 6,849,915 B1
(45) Date of Patent: Feb. 1, 2005

(54) LIGHT SENSITIVE SEMICONDUCTOR PACKAGE AND FABRICATION METHOD THEREOF

(75) Inventor: Chung-Che Tsai, Hsinchu (TW)

(73) Assignee: Ultra Tera Corporation (TW)

( * ) Notice: Subject to any disclaimer, the term of this patent is extended or adjusted under 35 U.S.C. 154(b) by 0 days.

(21) Appl. No.: 10/649,847

(22) Filed: Aug. 26, 2003

(51) Int. Cl.$^7$ .................. H01L 31/0232; H01L 21/00
(52) U.S. Cl. .............. 257/432; 257/434; 257/667; 257/787; 438/64; 438/112; 438/116
(58) Field of Search .................. 257/432–434, 257/667, 787, 704, 723; 438/64, 65, 116, 112

(56) References Cited

U.S. PATENT DOCUMENTS 6,686,667 B2 * 2/2004 Chen et al. .............. 257/787

* cited by examiner

Primary Examiner—Mark V. Prenty
(74) Attorney, Agent, or Firm—Anderson Kill & Olick; Eugene Lieberstein; Michael N. Meller

(57) ABSTRACT

A light sensitive semiconductor package and a fabrication method thereof are provided in which a chip is mounted on a chip carrier and encompassed by a dam, and an infrared filter is attached to the dam to hermetically isolate the chip from the atmosphere. An encapsulant is formed on the chip carrier and surrounds the dam, and a lens is supported by the encapsulant to be positioned above the infrared filter. This allows light to penetrate through the infrared filter and lens to reach the chip. Before forming the encapsulant and mounting the lens, the semi-fabricated package with the chip being hermetically isolated by the infrared filter and dam is subject to a leak test, allowing a semi-fabricated package successfully passing the test to be formed with the encapsulant and lens, so as to reduce fabrication costs and improve yield of fabricated package products.

16 Claims, 2 Drawing Sheets

LIGHT SENSITIVE SEMICONDUCTOR PACKAGE AND FABRICATION METHOD THEREOF

FIELD OF THE INVENTION

The present invention relates to semiconductor packages and fabrication methods thereof, and more particularly, to a light sensitive semiconductor package incorporated with at least one image sensor chip such as CMOS (complementary metal oxide semiconductor) chip, and a method for fabricating the semiconductor package.

BACKGROUND OF THE INVENTION

Semiconductor packages are electronic devices for accommodating active components such as semiconductor chips, whose structure is primarily composed of a chip mounted on a chip carrier (such as substrate, lead frame, etc.) and electrically connected to the chip carrier by means of conductive elements such as bonding wires; an encapsulant is formed by a resin compound (such as epoxy resin, etc.) on the chip carrier to encapsulate the chip and bonding wires which are protected against external moisture and contaminant. The encapsulant is usually opaque or non-transparent, thereby making a light sensitive or image sensor chip that requires light for operation not suitably incorporated in such a semiconductor package.

Accordingly, a semiconductor package with a structurally modified encapsulant for allowing light to reach a light sensitive chip is provided as illustrated in FIG. 4. In this semiconductor package, a light sensitive chip 20 such as CMOS (complementary metal oxide semiconductor) chip is mounted on a substrate 21 and electrically connected to the substrate 21 by a plurality of bonding wires 22. An encapsulant 23 is formed on the substrate 21 and shaped as a wall structure surrounding the chip 20 and bonding wires 22; this wall-shaped encapsulant 23 forms a cavity 24 where the chip 20 and bonding wires 22 are received and exposed without being encapsulated by the encapsulant 23. An infrared filter 25 and a lens 26 are mounted and supported by the encapsulant 23 to seal an opening of the cavity 24 and hermetically isolate the chip 20 and bonding wires 22 from the external atmosphere, wherein the infrared filter 25 is disposed above the chip 20 and the lens 26 is disposed above the infrared filter 25. The infrared filter 25 and lens 26 are made of light permeable materials to allow light to penetrate therethrough and reach the chip 20 to facilitate operation of the chip 20. This completes fabrication of the semiconductor package.

The above fabricated semiconductor package is subject to a leak test to test if the cavity 24 is hermetically sealed and the chip 20 and bonding wires 22 are hermetically isolated. For example, normally the atmosphere or an ambient environment contains around 500,000 to 1000,000 dust particles, while a clean environment suitable for situating the chip can only contain around 10,000 dust particles. As a result, the chip is processed or mounted on the substrate in a clean room meeting such a low-particle requirement and needs to be isolated from the atmosphere to maintain low content of dust particles and prevent external dusts from contaminating the environment around the chip. In this case, the wall-structured encapsulant 23 surrounding the cavity 24 where the chip 20 is received and the infrared filter 25 and lens 26 sealing the cavity 24 provide such a chip-isolation function, and the leak test is used to test if any leakage occurs from the chip-isolation mechanism in order to assure the low-particle standard being maintained in the cavity 24. If a fabricated semiconductor package fails the leak test, external dust particles may invade the internal environment of the package and contaminate an incorporated chip, thereby making this semiconductor package fail in operation and normally discarded, which would lead to significant waste in costs as one lens costs around USD $1 and also degrade production yield.

Therefore, the problem to be solved herein is to provide a light sensitive semiconductor package which can reduce fabrication costs and improve yield of fabricated package products.

SUMMARY OF THE INVENTION

A primary objective of the present invention is to provide a light sensitive semiconductor package and a fabrication method thereof, in which a chip is hermetically isolated from the atmosphere by a dam and a first light permeable member formed on a chip carrier where the chip is mounted, and such a semi-fabricated package structure only if passing a leak test can undergo subsequent fabrication processes such as molding, thereby reducing fabrication costs and improving yield of fabricated package products.

In accordance with the foregoing and other objectives, the present invention proposes a light sensitive semiconductor package, including: a chip carrier having an upper surface and an opposite lower surface; at least one first chip mounted on and electrically connected to the upper surface of the chip carrier; a dam formed on the upper surface of the chip carrier and having a cavity for receiving the first chip therein; a first light permeable member attached to the dam to seal an opening of the cavity and hermetically isolate the first chip from the atmosphere; an encapsulant formed on the chip carrier and surrounding the dam; and a second light permeable member supported by the encapsulant and disposed above the first light permeable member.

In another embodiment, the chip carrier is formed with a through hole penetrating therethrough, and the first chip is mounted over the through hole. As a result, at least one second chip can be attached to the first chip and received in the through hole of the chip carrier, allowing the second chip to be electrically connected to the lower surface of the chip carrier and encapsulated by the encapsulant. The first chip is an image sensor chip such as CMOS (complementary metal oxide semiconductor) chip, and light can penetrate through the first and second light permeable members to reach the first chip and facilitate operation of the first chip.

The above semiconductor package according to the invention yields significant benefits. Before fabricating the encapsulant and mounting the second light permeable member (lens), the chip (first chip) and bonding wires formed on the chip carrier are encompassed by the wall-structured dam and first light permeable member (infrared filter) which cooperatively form a cavity for receiving and isolating the first chip and bonding wires from the atmosphere. At this stage, the semi-fabricated package structure is subject to a leak test to test if the cavity is hermetically sealed and the first chip and bonding wires are hermetically isolated. This allows only a semi-fabricated package structure successfully passing the leak test to be performed with subsequent fabrication processes for forming the encapsulant and second light permeable member. In other words, if the above semi-fabricated package structure fails the leak test, it can be discarded and would not be subsequently formed with the encapsulant and second light permeable member, thereby saving costs for performing the molding process and attaching the second light permeable member or lens (which costs around USD $1) and improving yield of fabricated package products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a light sensitive semiconductor package and a fabrication method thereof proposed in the present invention are described with reference to FIGS. 1, 2A–2C and 3.

First Preferred Embodiment

Figure 1:
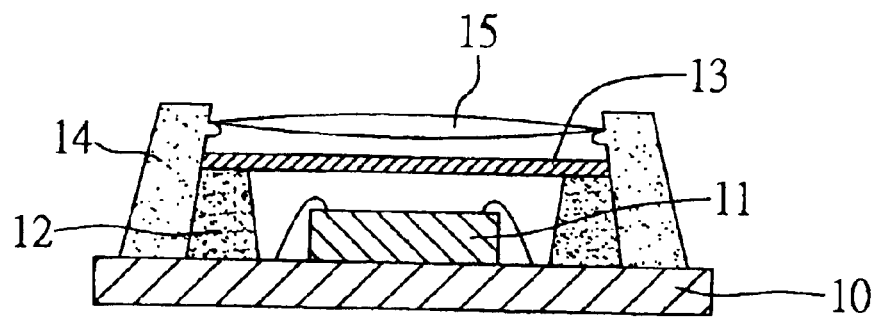
FIG. 1 is a cross-sectional view of a semiconductor package according to a first preferred embodiment of the invention.

As shown in FIG. 1, a light sensitive semiconductor package according to a first preferred embodiment of the invention includes: a chip carrier 10; at least one chip 11 mounted on and electrically connected to the chip carrier 10; a dam 12 formed on the chip carrier 10 and surrounding the chip 11; a first light permeable member 13 attached to the dam 12 for hermetically isolating the chip 11 from the atmosphere; an encapsulant 14 formed on the chip carrier 10 and surrounding the dam 12; and a second light permeable member 15 supported by the encapsulant 14 and disposed above the first light permeable member 13, allowing light to penetrate through the first and second light permeable members 13, 15 to reach the chip 11 and facilitate operation of the chip 11.

Figure 2A:
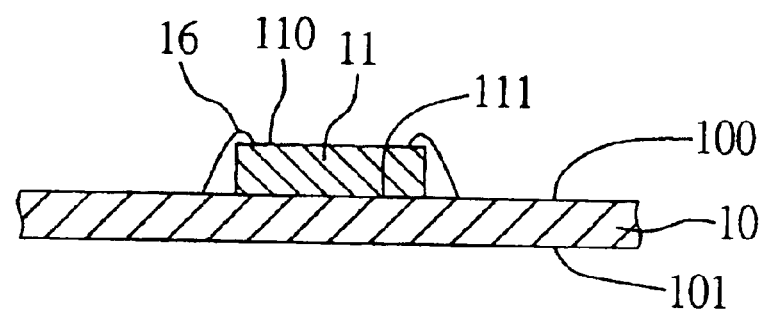
FIGS. 2A–2C are schematic diagrams showing procedural steps for fabricating the semiconductor package shown in FIG. 1.
Figure 2B:
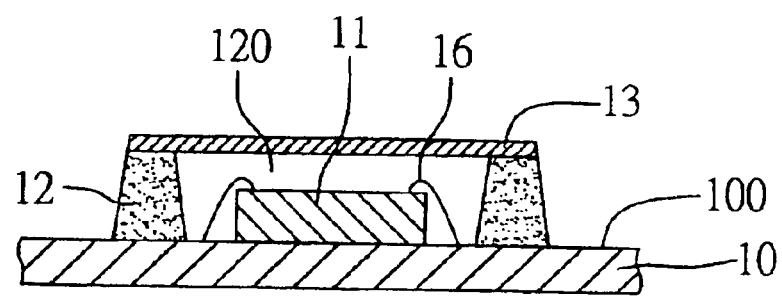
Figure 2C:
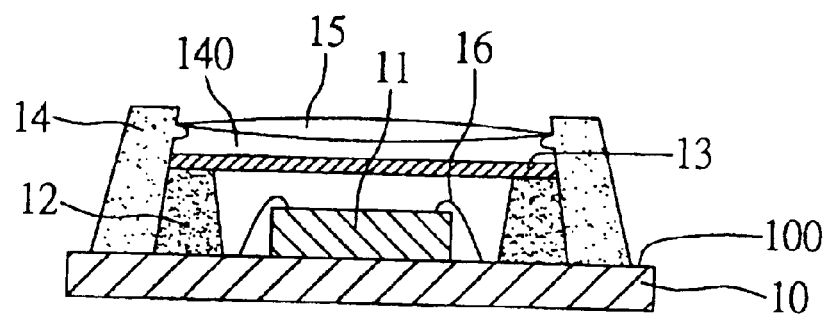

The above light sensitive semiconductor package can be fabricated by a series of procedural steps illustrated in FIGS. 2A–2C.

Referring to FIG. 2A, the first step is to prepare a chip carrier 10 having an upper surface 100 and an opposite lower surface 101. The chip carrier 10 is primarily made of a conventional resin material such as epoxy resin, polyimide resin, BT (bismaleimide triazine) resin, FR4 resin, etc. The chip carrier 10 can be a substrate or a lead frame.

The next step is to prepare a chip 11 having an active surface 110 and an opposite inactive surface 111, the active surface 110 being formed with a plurality of electronic elements and circuits (not shown) thereon. The chip 11 is mounted on the chip carrier 10 in a face-up manner that the inactive surface 111 of the chip 11 is attached to the upper surface 100 of the chip carrier 10, and the active surface 110 of the chip 11 faces upwardly. Then, a wire-bonding process is performed to form a plurality of bonding wires 16 that are bonded to bond pads (not shown) formed on the active surface 110 of the chip 11 and to bond fingers (not shown) formed on the upper surface 100 of the chip carrier 10 so as to electrically connect the chip 11 to the chip carrier 10. The chip 11 can be an image sensor chip such as a CMOS (complementary metal oxide semiconductor) chip.

Referring to FIG. 2B, a dam 12 is formed on the upper surface 100 of the chip carrier 10 by for example a conventional printing technique. The dam 12 is shaped as a wall structure having a cavity 120 for receiving the chip 11 and bonding wires 16; the cavity 120 is dimensioned sufficiently to allow the chip 11 and bonding wires 16 to be completely received therein. Then, a first light permeable member 13 is attached to the dam 12 to seal an opening of the cavity 120 and isolate the chip 11 and bonding wires 16 from the atmosphere; the first light permeable member 13 is positioned above the chip 11 and made of a light permeable material, such as a glass-made infrared filter, to allow light to be able to penetrate the first light permeable member 13 to reach the chip 11.

A leak test is performed for the above semi-fabricated structure to test if the chip 11 is hermetically isolated by the dam 12 and first light permeable member 13 from the atmosphere, and only allows a semi-fabricated structure successfully passing the leak test to be subject to subsequent fabrication processes. The leak test is conventional and not to be further detailed herein.

Referring to FIG. 2C, a molding process is performed for the above semi-fabricated structure passing the leak test to form an encapsulant 14 by a conventional resin compound (such as epoxy resin, etc.) on the upper surface 100 of the chip carrier 10. The encapsulant 14 is structured to surround the dam 12 and forms a cavity 140 where the dam 12, first light permeable member 13, chip 11 and bonding wires 16 are received. The encapsulant 14 can be made of a material same as or different from that for fabricating the dam 12.

Then, a second light permeable member 15, such as a lens, is mounted and supported by the encapsulant 14 to be positioned above the first light permeable member 13. The first and second light permeable members 13, 15 are used to concentrate and filter light that penetrates therethrough and reaches the chip 11 to facilitate operation of the chip 11. This completes the semiconductor package according to the first preferred embodiment of the invention.

Second Preferred Embodiment

Figure 3:
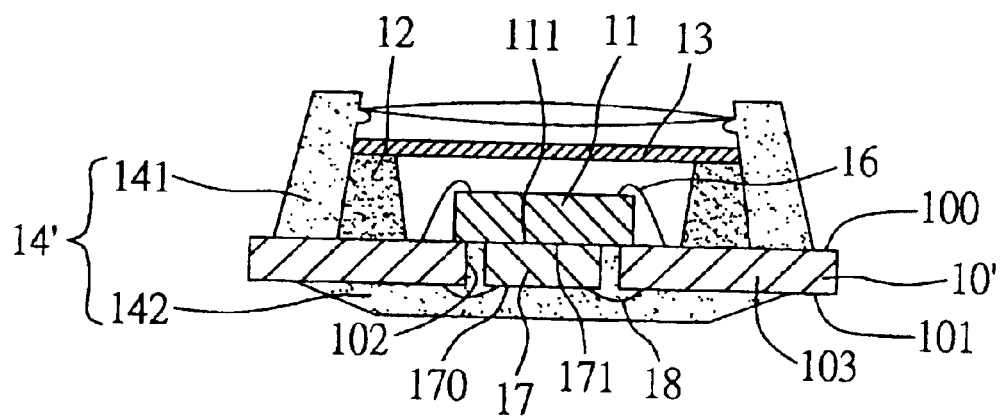
FIG. 3 is a cross-sectional view of a semiconductor package according to a second preferred embodiment of the invention.
Figure 4:
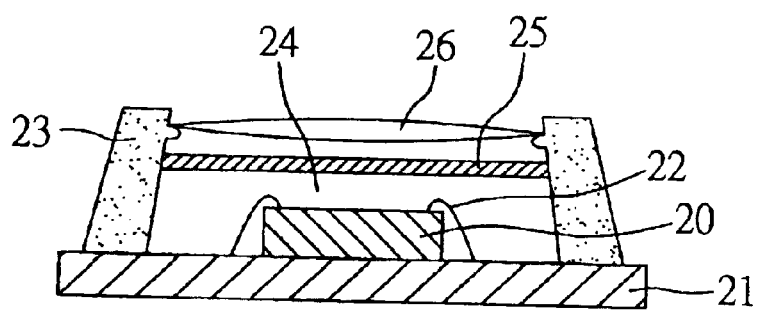
FIG. 4 (PRIOR ART) is a cross-sectional view of a conventional semiconductor package.

FIG. 3 illustrates a semiconductor package according to a second preferred embodiment of the invention. As shown in FIG. 3 this semiconductor package is structurally similar to that of the above first embodiment but differs in that a chip carrier 10' is formed with a through hole 102 penetrating through the upper and lower surfaces 100, 101 of the chip carrier 10', allowing the chip 11 (hereinafter referred to as "first chip") to be mounted over the through hole 102 on the upper surface 100 of the chip carrier 10', with the inactive surface 111 of the first chip 11 being partly exposed to the through hole 102. The chip carrier 10' can be a substrate formed with the through hole 102, or a lead frame having a plurality of leads 103 surrounding the through hole 102. At least one second chip 17 is attached to the first chip 11 via the through hole 102 and received in the through hole 102 of the chip carrier 10'. The second chip 17 has an active surface 170 and an opposite inactive surface 171, wherein the inactive surface 171 is mounted to the exposed part of the inactive surface 111 of the first chip 11, and the active surface 170 of the second chip 17 is electrically connected to a lower surface 101 of the chip carrier 10' by a plurality of bonding wires 18. An encapsulant 14' formed on the chip carrier 10' is composed of a first portion 141 on the upper surface 100 of the chip carrier 10' and a second portion 142 on the lower surface 101 of the chip carrier 10'. The first portion 141 of the encapsulant 14' is structured to form a cavity 140 for receiving the dam 12, first light permeable member 13, chip 11 and bonding wires 16. The second portion 142 of the encapsulant 14' fills into the through hole 102 of the chip carrier 10' and encapsulates the second chip 17 and bonding wires 18 which are protected against external moisture and contaminant. This provides a multi-chip or stacked-chip package structure having a plurality of chips (first and second chips 11, 17) which can enhance performances of the semiconductor package by operation of the multiple chips incorporated therein.

The above semiconductor package according to the invention yields significant benefits. Before fabricating the encapsulant and mounting the second light permeable member (lens), the chip (first chip) and bonding wires formed on the chip carrier are encompassed by the wall-structured dam and first light permeable member (infrared filter) which cooperatively form a cavity for receiving and isolating the first chip and bonding wires from the atmosphere. At this stage, the semi-fabricated package structure is subject to a leak test to test if the cavity is hermetically sealed and the first chip and bonding wires are hermetically isolated. This allows only a semi-fabricated package structure successfully passing the leak test to be performed with subsequent fabrication processes for forming the encapsulant and second light permeable member. In other words, if the above semi-fabricated package structure fails the leak test, it can be discarded and would not be subsequently formed with the encapsulant and second light permeable member, thereby saving costs for performing the molding process and attaching the second light permeable member or lens (which costs around USD $1) and improving yield of fabricated package products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A light sensitive semiconductor package, comprising:
   a chip carrier having an upper surface and an opposite lower surface, wherein the chip carrier is formed with a through hole penetrating therethrough;
   at least one first chip mounted on the upper surface of the chip carrier and over the through hole with the first chip electrically connected to the upper surface of the chip carrier;
   at least one second chip attached to the first chip and received in the through hole of the chip carrier, such that the second chip is electrically connected to the lower surface of the chip carrier;
   a dam formed on the upper surface of the chip carrier and having a cavity for receiving the first chip therein;
   a first light permeable member attached to the dam to seal an opening of the cavity and hermetically isolate the first chip from the atmosphere;
   an encapsulant formed on the chip carrier to surround the dam and encapsulate the second chip; and
   a second light permeable member supported by the encapsulant and disposed above the first light permeable member.

2. The semiconductor package of claim 1, wherein the first and second chips are electrically connected to the chip carrier by a plurality of bonding wires, respectively.
3. The semiconductor package of claim 1, wherein the first light permeable member is an infrared filter.
4. The semiconductor package of claim 1, wherein the second light permeable member is a lens.
5. The semiconductor package of claim 1, wherein the chip carrier is a substrate or a lead frame.
6. The semiconductor package of claim 1, wherein the chip carrier is a substrate formed with the through hole, or a lead frame having a plurality of leads surrounding the through hole.
7. The semiconductor package of claim 1, wherein the dam is made of a material same as that for fabricating the encapsulant.
8. The semiconductor package of claim 1, wherein the dam is made of a material different from that for fabricating the encapsulant.
9. A fabrication method of a light sensitive semiconductor package, comprising the steps of:
   preparing a chip carrier having an upper surface and an opposite lower surface, wherein the chip carrier is formed with a through hole penetrating therethrough;
   mounting at least one first chip over the through hole and on the upper surface of the chip carrier and electrically connecting the first chip to the chip carrier;
   attaching at least one second chip to the first chip and receiving the second chip in the through hole of the chip carrier, allowing the second chip to be electrically connected to the lower surface of the chip carrier;
   forming a dam on the upper surface of the chip carrier, the dam having a cavity for receiving the first chip therein;
   attaching a first light permeable member to the dam to seal an opening of the cavity and hermetically isolate the first chip from the atmosphere;
   forming an encapsulant on the chip carrier to surround the dam and to encapsulate the second chip; and
   mounting a second light permeable member to be supported by the encapsulant and disposed above the first light permeable member.

10. The fabrication method of claim 9, wherein the first and second chips are electrically connected to the chip carrier by a plurality of boding wires, respectively.
11. The fabrication method of claim 9, wherein the first light permeable member is an infrared filter.
12. The fabrication method of claim 9, wherein the second light permeable member is a lens.
13. The fabrication method of claim 9, wherein the chip carrier is a substrate or a lead frame.
14. The fabrication method of claim 9, wherein the chip carrier is a substrate formed with the through hole, or a lead frame having a plurality of leads surrounding the through hole.
15. The fabrication method of claim 9, wherein the dam is made of a material same as that for fabricating the encapsulant.
16. The fabrication method of claim 9, wherein the dam is made of a material different from that for fabricating the encapsulant.

* * * * *